United States Patent [19]

Hodges et al.

[11] 4,185,269
[45] Jan. 22, 1980

[54] ERROR CORRECTING SYSTEM FOR SERIAL BY BYTE DATA

[75] Inventors: Paul Hodges; Werner J. Schaeuble; Paul L. Shaffer, all of San Jose, Calif.

[73] Assignee: International Business Machines Corporation, Armonk, N.Y.

[21] Appl. No.: 921,148

[22] Filed: Jun. 30, 1978

[51] Int. Cl.² .................. G06F 11/10; G06F 11/12
[52] U.S. Cl. ........................... 340/146.1 AL
[58] Field of Search ............................ 340/146.1 AL

[56] References Cited

U.S. PATENT DOCUMENTS

| | | | |
|---|---|---|---|
| 3,163,848 | 12/1964 | Abramson | 340/146.1 AL |
| 3,478,313 | 11/1969 | Srinivasan | 340/146.1 AL |
| 3,725,859 | 4/1973 | Blair et al. | 340/146.1 AL |
| 3,745,526 | 7/1973 | Hong et al. | 340/146.1 AL |
| 3,825,893 | 7/1974 | Bossen et al. | 340/146.1 AL |
| 3,913,068 | 10/1975 | Patel | 340/146.1 AL |

OTHER PUBLICATIONS

Stojko et al., "Error-Correction Code," *IBM Tech. Disclosure Bulletin*, vol. 10, No. 10, Mar. 1968, pp. 1437-1438.

Bossen, "Adjacent Error Correction, *IBM Journal of Research Development*, Jul. 1970, pp. 402-408.

*Primary Examiner*—David H. Malzahn
*Attorney, Agent, or Firm*—Richard E. Cummins

[57] ABSTRACT

A system is disclosed for generating a plurality of error correcting check ECC bytes from a block of data presented to the system in serial by byte form. The system employs a plurality of ECC channels which operate in parallel with the channels generating check bytes from interleaved subsets of the data block. One channel generates an ECC parity check byte for each interleaved subset while another channel generates an ECC locator check byte for each interleaved subset of data. The ECC locator check byte for each subset represents the parity or modulo 2 sum of bit positions which are selected systematically in accordance with a predefined m sequence which is unique to each channel that generates locator check bytes. Error patterns greater than the number of bits in one byte are correctable, as are error patterns which are less than the number of bits in one byte but extend across byte boundaries of two adjacent bytes in different subsets.

19 Claims, 15 Drawing Figures

GENERATION OF $C_1C_2C_3$ $C_1$ = EXCLUSIVE OR OF ALL X SUBSET BYTES
$C_2$ = EXCLUSIVE OR OF ALL Y SUBSET BYTES
$C$ = EXCLUSIVE OR OF ALL Z SUBSET BYTES

WRITE TRANSFER ECC BYTE GENERATION

| CONTENTS END OF BYTE TIME | LOCATION | DATA BYTE | CHANNEL 0 | 1 | 2 | 3 |
|---|---|---|---|---|---|---|
| 0 | 0 | C5 | FF $\frac{C5}{3A}$ | FF | FF $\frac{C5}{74}$ | FF |
| 1 | 1 | 18 | → + $\frac{EF}{D5}$ | → + $\frac{18}{E7}$ | $\frac{18}{BF}$ | $\frac{18}{D3}$ |
| 2 | 2 | 8E | | → + $\frac{8E}{71}$ | $\frac{8E}{E2}$ | |
| 3 | 3 | EF | | → + $\frac{01}{E6}$ | $\frac{01}{0D}$ | $\frac{01}{B9}$ |
| 4 | 4 | 01 | | $\frac{52}{23}$ | $\frac{52}{11}$ | $\frac{8E}{E2}$ → + $\frac{52}{7D}$ |
| 5 | 5 | 52 | E6 2 | 2 3 | 0 5 | B9 8 |
| | | | | 4 7 | 1 6 | 2 B 7 |
| | | | | | | 7 D 9 |
| ECC BYTES | | | D5 1 | | | |

READ TRANSFER NO ERROR

| | | CHANNEL 0 | | CHANNEL 1 | | CHANNEL 2 | | CHANNEL 3 | |
|---|---|---|---|---|---|---|---|---|---|
| | | LOC 0 | LOC 1 | LOC 0 | LOC 1 | LOC 0 | LOC 1 | LOC 0 | LOC 1 |
| CONTENTS END OF BYTE TIME | BYTE TIME ECC | | | | | | | | |
| D 5 | 6 | D 5 | 0 0 | E 6 | 0 0 | 4 7 | 0 0 | 2 B | 0 0 |
| E 6 | 7 | 0 0 | | 0 0 | | 0 D | | B 9 | 7 D |
| 2 3 | 8 | | | 2 3 | 0 0 | 1 1 | 0 0 | | |
| 4 7 | 9 | | | 0 0 | | 0 0 | | | |
| 0 D | 10 | | | | | 0 0 | 0 0 | | |
| 1 1 | 11 | | | | | | | 0 0 | |
| 2 B | 12 | | | | | | | 0 0 | 0 0 |
| B 9 | 13 | | | | | | | | |
| 7 D | 14 | | | | | | | | |
| SYNDROME BYTES | | 0 0 | 0 0 | 0 0 | 0 0 | 0 0 | 0 0 | 0 0 | 0 0 |

FIG. 9C

ERROR CORRECTING SYSTEM FOR SERIAL BY BYTE DATA

TECHNICAL FIELD

This invention relates, in general, to error detecting and correcting systems, and specifically to a system for generating ECC check bytes for a serial by byte data stream. The system finds particular application in the environment of a disk file controller which is controlling the transfer of data between a serial by byte interface and a serial by bit interface in which the control of the data transfer is achieved through a microprocessor which is running at the data rate and in which the ECC system can be synchronized with the operation of the microprocessor.

BACKGROUND ART

Various arrangements are known in the art for generating error correcting check bytes and their corresponding error syndromes during a read back process. ECC check bytes of error correcting systems generally represent the parity condition of a number of predetermined bit positions in the data block that is being checked. On the read back process, the data is processed in a manner which results in a corresponding number of "syndrome bytes" being generated.

The check bytes generated during the write process are compared with the check bytes generated during the read process and the results are the syndrome bytes. The syndrome bytes will be all zeros if no error has occurred in the data block and the ECC check bytes on read back. If an error has occurred, one or more of the syndrome bytes will not be all zeros, and the resulting pattern of ones and zeros indicate the type of error that has occurred and its location.

The present system is based on the concept suggested by Hamming where parity is taken over preselected bit positions on the block of data according to some systematic approach such that when the parity bits are assembled, they represent unique groups of ones and zeros for the data which has been checked. When the data and the check bytes are again read, these ECC check bytes are, in effect, exclusively OR'd with the newly generated ECC check bytes which should result in an all zeros pattern since the parity bits cancel out each other.

In many applications, such as the recording of large blocks of data of a disk file, it is necessary to store with this data error correcting check bits so that on transferring the stored data from the file back to the system, any errors that might have occurred either in the recording or the read back process can be checked and the system notified that an error has occurred or the ECC system can correct the error prior to sending it back to the host system. In such an environment, the ECC system must have the ability to operate at a relatively high rate in order not to interfere with the transfer of data between the disk file and the system. In addition, the ECC system must have the ability to append the generated ECC check bytes during the write operation to the stream of serial by bit data that is being recorded. In other words, immediately following the last byte of data to be recorded, the ECC system must supply the first check byte and the subsequent check bytes which are recorded with the data block from the host system. Similarly, on the read back process, the error syndromes which are generated to indicate whether an error has occured or not, and the type of error and its location, must be immediately available to the host system in order to prevent any erroneous data from being operated on in a subsequent operation. Further, as data transfer rates between data processing system and disk files increase to ranges of two megabytes per second, the need for a fast, efficient, simply-controlled ECC system becomes quite significant.

There is, therefore, a need for a fast, efficient, simply-controlled error correcting system which can operate at speeds comparable to machine cycle times of microprocessors and be synchronized therewith.

BRIEF DESCRIPTION OF DRAWINGS

FIGS. 7A and 7B comprise a timing chart for the various signals of the system. FIG. 7C illustrates how FIGS. 7A and 7B are combined.

FIG. 8C illustrates how FIGS. 8A and 8B are combined.

DISCLOSURE OF INVENTION

Figure 1:
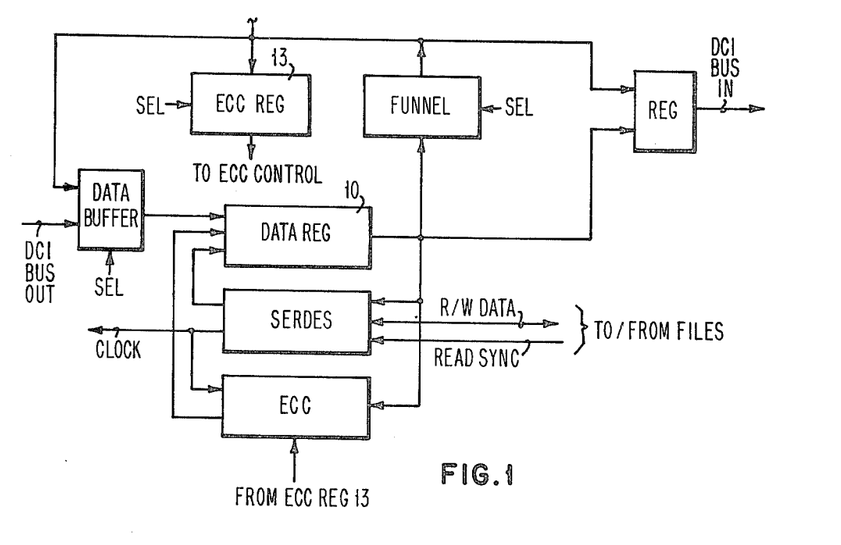
FIG. 1 illustrates an embodiment of a parallel to serial data channel in which the present invention may be advantageously employed.

The system of the present invention is designed to generate nine ECC check bytes, each having eight bits, from a block of data having 512 (8 bit) bytes. As shown in FIG. 1, the 512 bytes are supplied from a data register 10 to the input of the ECC hardware system. The nine ECC check bytes are supplied to the input of the data register after they are generated immediately following the 512 byte clock of data so that a continuous stream of data, consisting of 521 bytes, is sent to the output of the data register where it may be sent to the serializer and on to the disk drive. The ECC hardware is controlled from a register 13 which is loaded with an appropriate control word from, for example, a microprocessor as described in more detail in copending applications Ser. Nos. 921,146 and 921,147, filed concurrently herewith.

Figure 2:
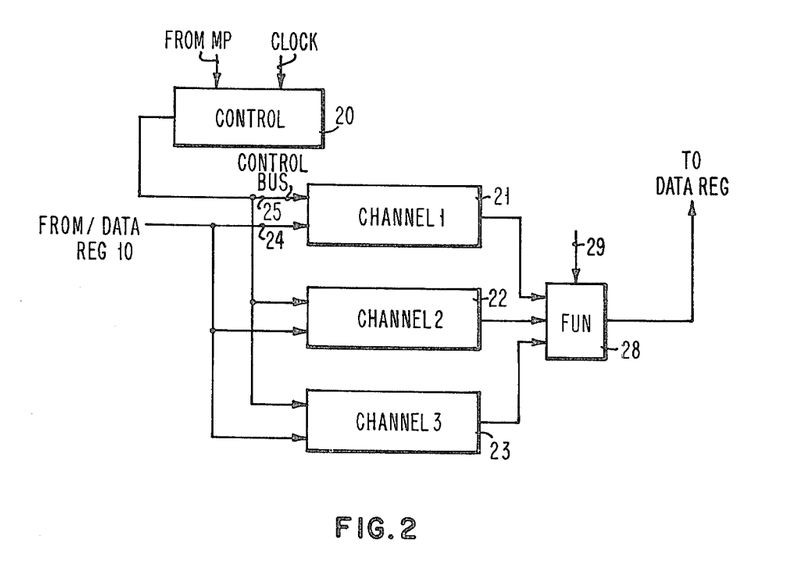
FIG. 2 illustrates in block diagram form the ECC system of the present invention.

The ECC system is shown in more detail in FIG. 2. With reference to FIG. 2, the ECC system consists generally of control section 20 and three separate ECC check byte channels 21, 22 and 23, which are substantially identical. Each channel has an input 24 connected to the serial by byte data stream from the data register 10 of FIG. 1. Each channel also has an input 25 connected to control block 20 to receive appropriate control signals. Control block 20 has its input connected to the output of the ECC control register 13 of FIG. 1. The output of the channels 21, 22, 23 are connected to the input of the data register 10 through funnel 28, which is controlled by a line 29 from control box 20.

Figure 3:
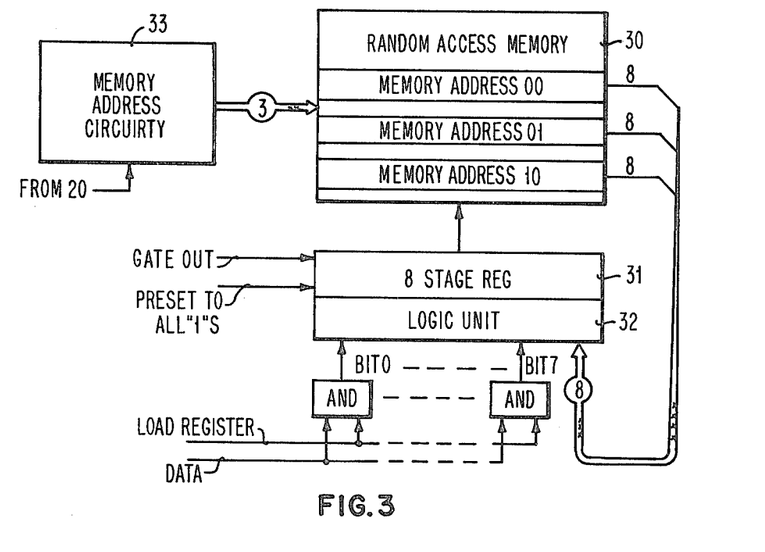
FIG. 3 illustrates in detail the various components of the ECC channels shown in FIG. 2.

FIG. 3 shows one ECC channel consisting basically of a random access memory unit 30, an eight stage register 31, and a logical unit 32 for controlling the output of the RAM relative to the input of the register. RAM 30 is provided with suitable read/write control and address circuitry 33 which is supplied with address and control signals from control box 20. Channel 1 functions to generate three ECC check bytes and, therefore, three unique storage locations are addressable sequentially by address circuitry 33 in response to address signals from the control box 20. Address 00 is used for ECC check byte 1; address 01 for ECC check byte 2; and address 10 for ECC check byte 3.

The output of the eight stage register 31 is connected to the input of RAM 30 so that the contents of register 31 can be transferred selectively to any of the three addresses 00, 01, or 10.

Figure 6:
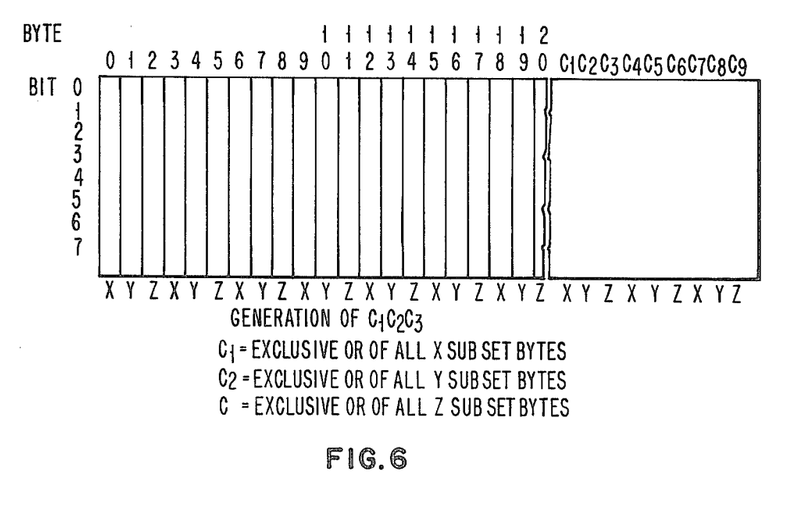
FIG. 6 illustrates a serial by byte stream of data showing the specific byte positions which are used to generate the various ECC check bytes.

In channel 1, the output of the RAM 30 is returned to the input of register 31 and is exclusively OR'd with the input data byte by means of exclusive OR circuits to thereby generate an ECC parity check byte. Memory location 00 stores the first ECC parity byte for a selected subset of the bytes presented from the data register which, as shown in FIG. 6, is data bytes 0, 3, 6, 9, etc. Location 01 stores the ECC parity check byte for a second subset of preselected bytes which, as shown in FIG. 6, are data bytes 1, 4, 7, 10, etc. Memory location 10 functions similarly for data bytes 2, 5, 8, 11, etc.

Channel 1's overall function is, therefore, to generate three distinct ECC parity check bytes, each parity check byte representing the modulo two sum of a subset of data bytes so that each bit of the parity byte represents the modulo two sum of the corresponding bit of each byte of the subset. In this instance, three ECC parity check bytes are used because the data block is divided into three subsets. Since the data block is greaater than 255 bytes, more than one ECC locator check byte must be generated. One locator check byte must be generated for each subset of 255 bytes. Since the error pattern can cross byte boundaries, at least two separate ECC parity check bytes must be generated to define the error patterns in adjacent data bytes which are in different subsets. In the disclosed embodiment, the data block being processed is 512 bytes, but is divided into three subsets with one ECC parity check byte being generated for each subset. Two separate ECC locator check bytes are, however, generated for each subset as an additional check on the error location.

The output of the RAM 30 is also connected to funnel 28, as previously mentioned. Channels 2 and 3 are substantially identical to the channel just described except for the input to the register 31 from RAM 30 which is shifted one position to the left by the logic block 32 and selectively combined with the feedback pattern.

Figure 4:
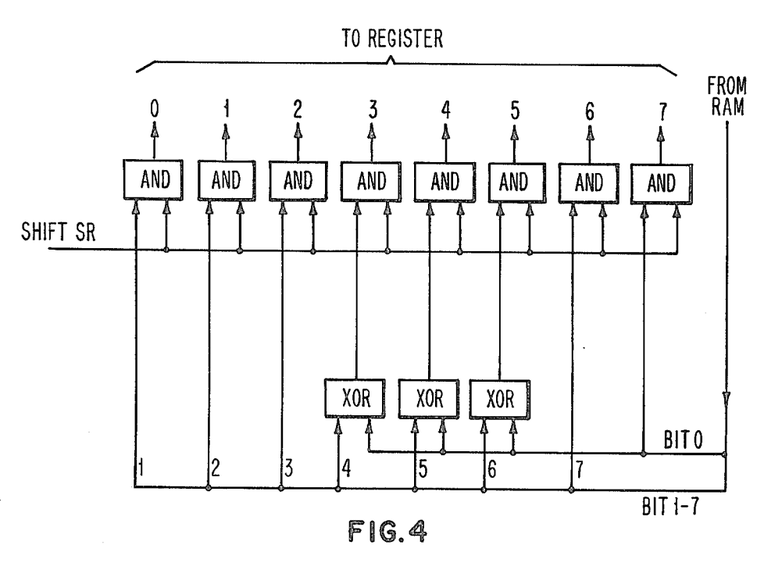
FIG. 4 illustrates the gating arrangement for the feedback signals in ECC channel 3.

FIG. 4 shows the input to the register of channel 3. As shown in FIG. 4, the series of AND/OR logic and exclusive OR logic units provide a shift function by connecting the output from RAM 30 to the next respective input stage of the register. For example, bit 0 of the RAM output is connected to the input of stage 7 of the register 31, bit 1 of the RAM output to the input of stage 0 of the register 31, and so forth. In addition to the shift function, the function of selectively exclusive OR'ing the output of the RAM with a feedback pattern depending on the contents of bit 0 of the RAM is also provided by the series of exclusive OR gates interconnected between the RAM output and the input to the selected stage of the register. The feedback pattern built into channel 3 is represented by 0001, 1100 which is expressed as X"1C" in hexadecimal notation. The feedback pattern for channel 2 is x"70" in hexadecimal notation.

The register 31 and the logical unit 32, therefore, functions much like an M sequence generator, or a feedback shift register.

Channel 2 generates three ECC locator check bytes over systematically defined bit positions of each subset. More specifically, ECC locator check byte 4 operates on the bytes of the subset associated with ECC parity byte 1. ECC byte 5 is similarly related to ECC byte 2 and ECC byte 6 with ECC byte 3.

The three ECC locator check bytes generated by channel 3 are associated with ECC bytes 1-3, respectively, in a similar manner. The third channel, in theory, is redundant in that it provides the same error location information as channel 2 and is used to confirm the displacement determined by channel 2 for the particular subset.

As shown in FIG. 2, the operation of the three channels to produce nine ECC check bytes from the serial by byte stream of data applied from the data register is controlled by signals supplied on a control bus to control input terminals 25. These signals are generated by control box 20 in response to timing signals from the external system and a series of control signals also received from the external system. One arrangement for supplying the control signals to the ECC control box is shown in copending application Ser. No. 921,146, previously referred to, where a microprocessor, whose operation is synchronized with the clock signal supplied to the ECC system, transfers a control byte of data to a selected register, such as ECC register 13.

Figure 5:
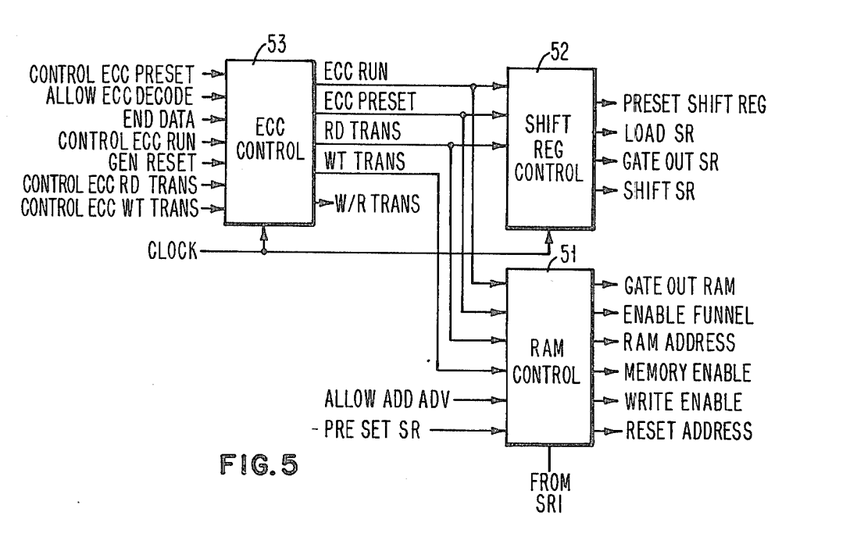
FIG. 5 illustrates in more detail the control logic shown in block diagram in FIG. 2.

The output of this control register 13 associated with the microprocessor is the input to the ECC control box 20 which is shown in detail in FIG. 5.

The control box as shown in FIG. 5 comprises a RAM control logic block 51, a register logic control block 52, and an ECC control block 53. The function of the ECC control block is to convert the control signals supplied to the input of block 20 to shift register control signals and RAM control signals which are active at the required time period to cause each channel to proceed through a series of operations on each byte of data by combining the control signals with selected clock or timing signals.

Any suitable logical arrangements known in the art may be employed and, hence, the details are not shown. The relationship of the input signals from the external source to the clock signals and the other control signals are shown in the timing diagram of FIG. 6.

The shift register control logic 52 provides four control signals for each channel. The Preset SR signal is connected to set each register to all ones at the beginning of the operation. The Load Shift Register signal is connected as shown in FIG. 3 to gate each byte of input data from the data register into the channel register. The Gate Out SR signal is supplied to each register to gate the output of the register to the RAM write circuits. The last signal, Shift SR, is supplied to only channels 2 and 3, and, as shown in FIG. 4, is applied to the logic units at the input of the register which gates the output of the RAM to input stages shifted by one position.

The RAM control logic 51 provides various control signals for the operation of the RAM. The first is the Gate Out RAM signal which places the contents of the addressed area of RAM onto the RAM output bus which is fed back to the channel register. The second signal, Enable Funnel, allows the output of one channel to be connected directly to the input of the data register at the time the ECC check bytes are being read out. The RAM Address signal comprises two lines which sequentially address the RAM of all three channels simultaneously by providing the 00, 01, and 10 pattern to the address circuitry, and may be developed by cycling a two-stage counter in response to clock signals, as is well known in the art. Address 00 is associated with ECC bytes 1, 4 and 7, address 01 with ECC bytes 2, 5 and 8, and address 10 with ECC bytes 3, 6 and 9. The Memory Enable signal allows the output of the RAM to be sampled. The Write Enable signal allows the input data from the register to be written into the RAM. The Reset Address signal returns the address circuitry to address 00. Each of these control signals are generated by logically combining selected input signals from the ECC control block and appropriate timing signals to achieve the correct control function.

The operation of the system from a data flow standpoint will now be explained in connection with the flow chart of FIG. 8 and the timing diagram of FIG. 7. The manner in which the nine ECC check bytes are used to indicate error pattern and error displacement will then be explained in connection with a simple six byte example, as shown in FIG. 9.

Figure 8A:
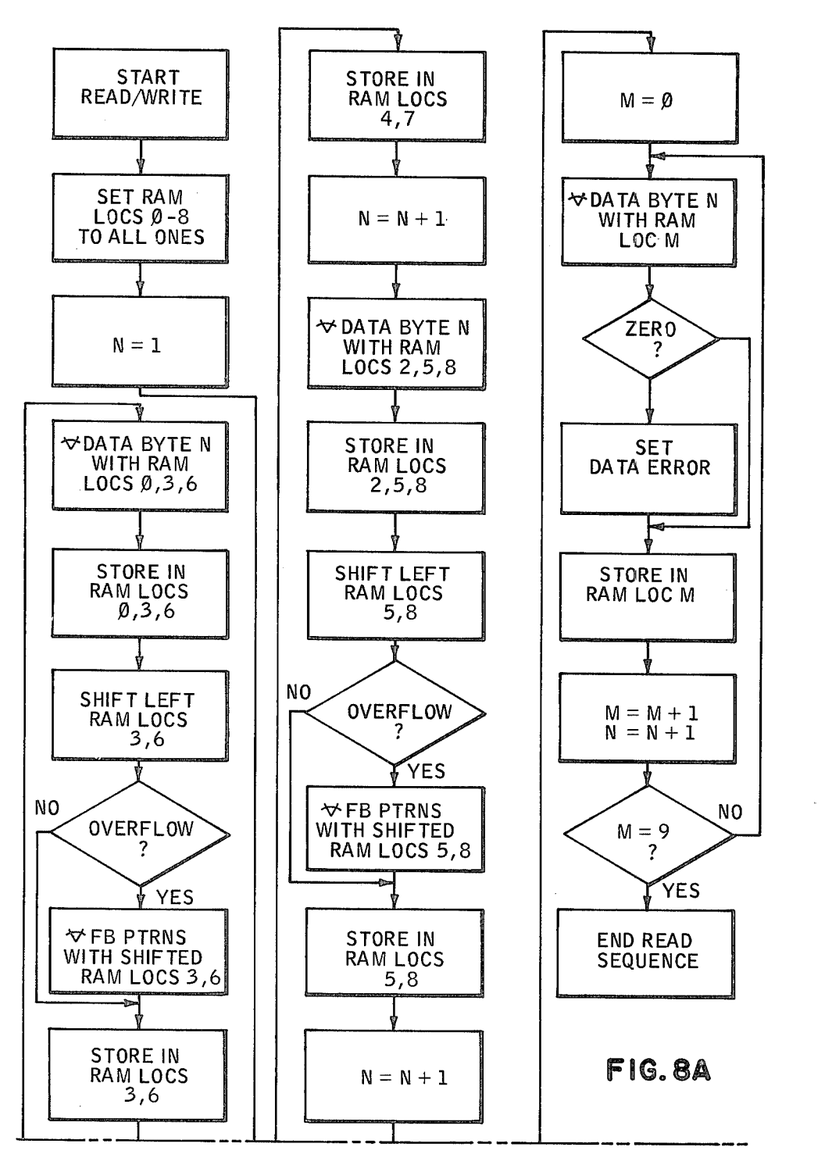
FIGS. 8A and 8B are a flow chart illustrating the operation of the ECC system as shown in FIGS. 1–5.
Figure 8B:
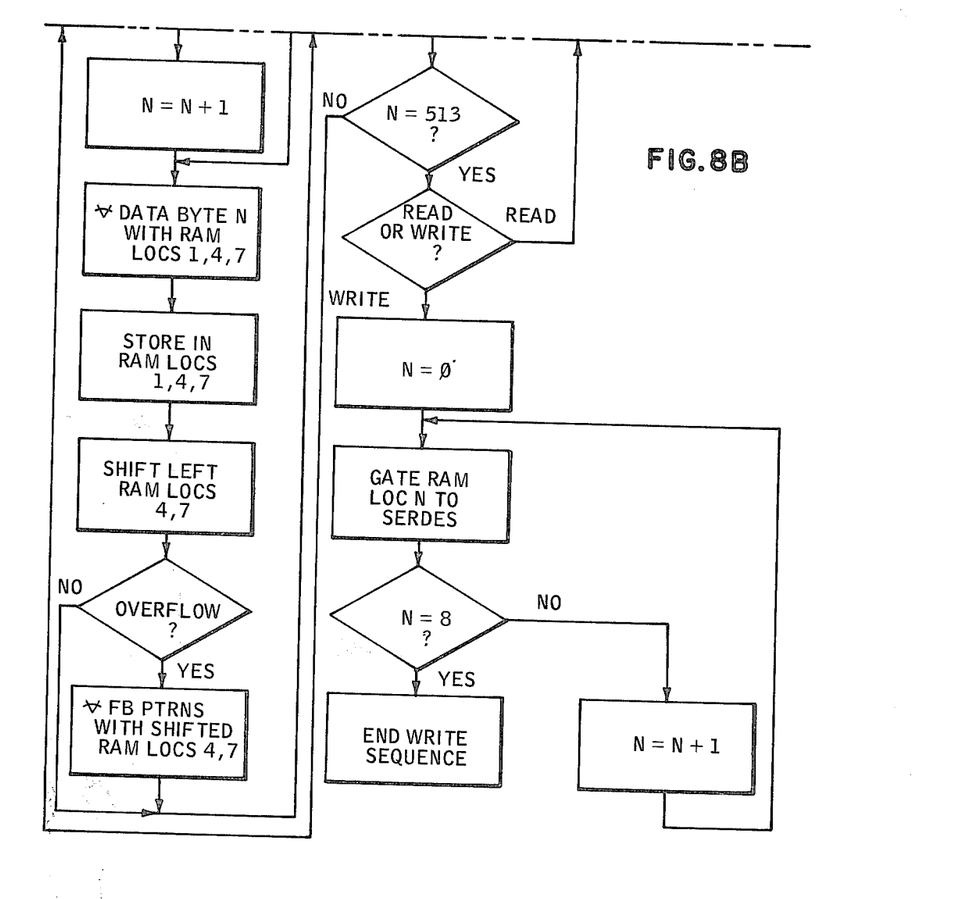
Figure 8C:
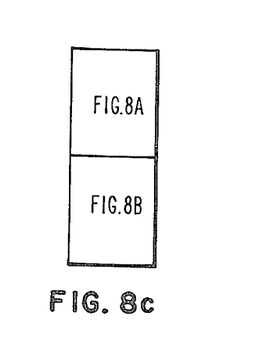
Figure 9A:
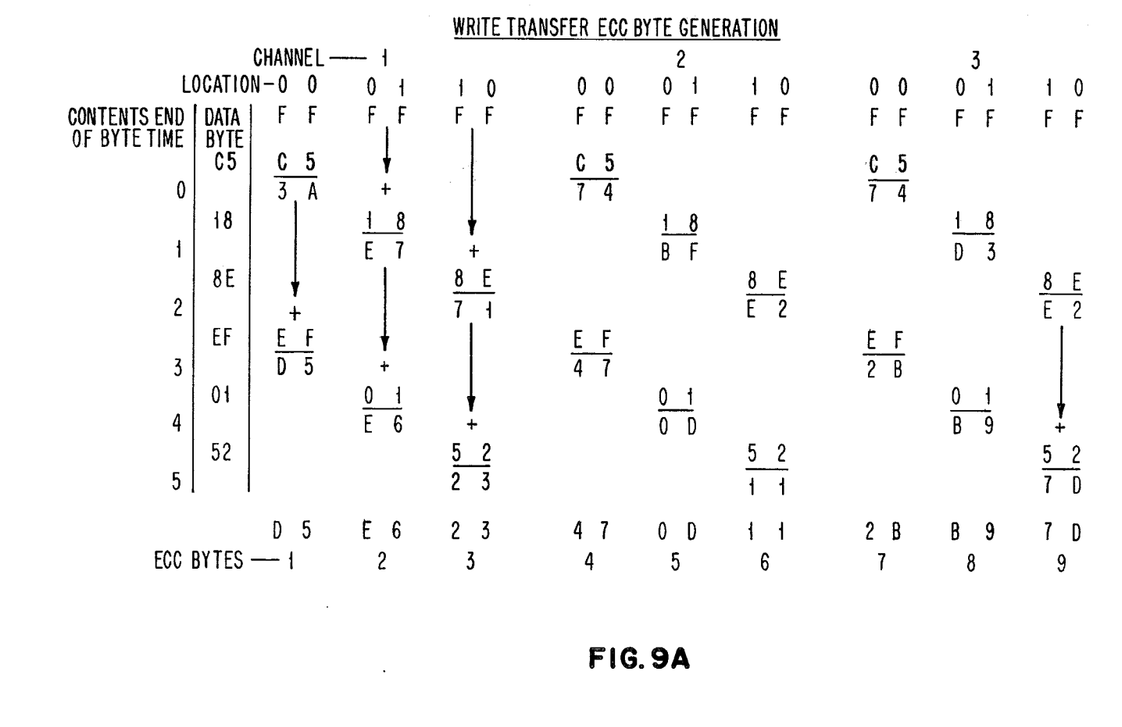
FIGS. 9A, 9B, and 9C are a chart showing a simple example of how the error syndrome bytes indicate the type of error and its displacement or location in the data stream.
Figure 9B:
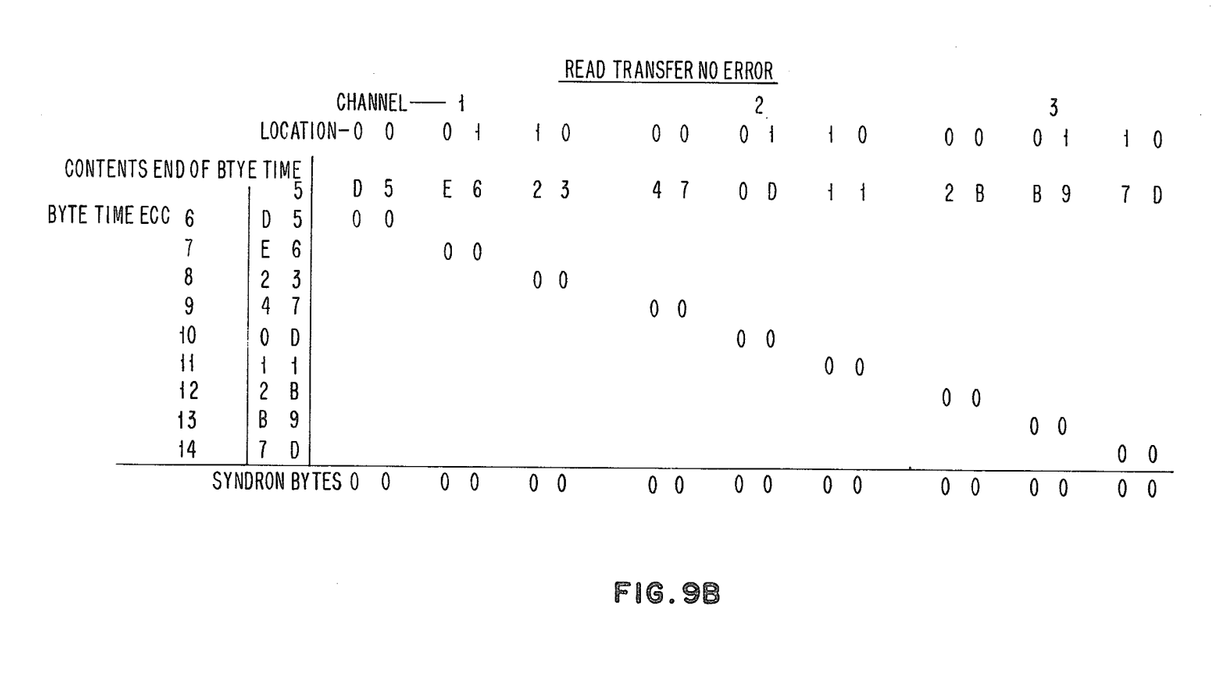
Figure 9C:
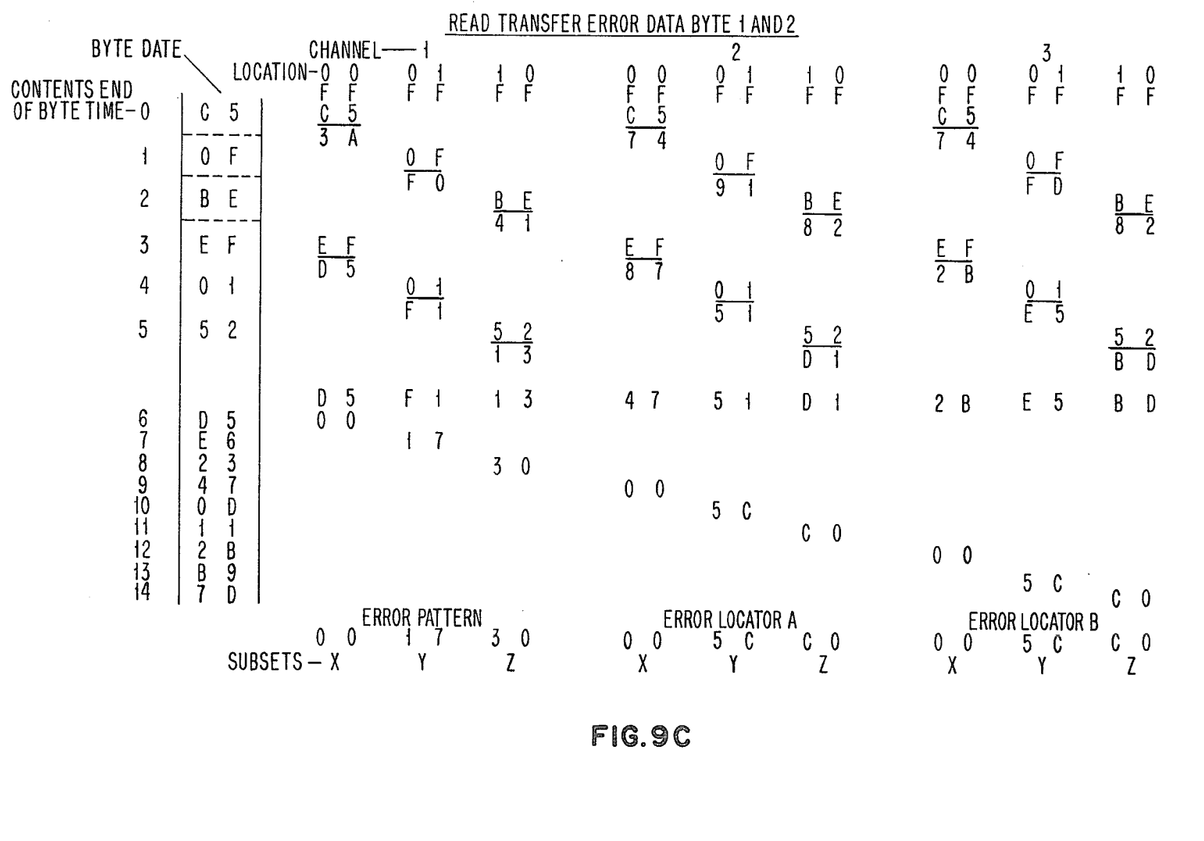

With reference to FIG. 8, the first preset operation sets the three locations in each RAM to an all ones pattern and resets all other circuitry to its correct state. The first byte of data is supplied in parallel to all three channels and is exclusive OR'd with the output of location 00 of each RAM. The registers at this point, therefore, contain the exclusive OR result of an all ones pattern and the first data byte. The results of this operation are returned to RAM location 00. The next operation involves transferring the contents of RAM location 00 of channels 2 and 3 back to the registers through the feedback paths, which will be operated on selectively depending on whether stage 0 of the respective RAM output is a 1 or a 0. The results of this operation are again placed in the register and the output of the register is then returned to RAM location 00. The addresses to all three RAM's are changed to 01 and the operation is repeated for the second byte of data. At the conclusion of that operation, the address to all three RAM's are changed to 10 and the operation is repeated for the third byte of data.

After the third byte of data has been processed, the RAM address circuitry returns the address to 00 and the next three bytes of data and subsequent groups of three bytes of data are processed in a similar manner. After 512 data bytes have been processed, depending on whether the system is in a read or write mode, the system will either transfer the nine ECC check bytes out through funnel 28, or will continue processing, if in a read mode, the previously generated and stored ECC check bytes which are being read in. At this time, if an all zeros pattern results on the read operation, no error indication will be provided and the operation ends. If after checking the ECC check bytes which were recorded, one or more of the syndrome bytes is not all zeros, an error condition is set and the nine ECC syndrome bytes are read out to some external system where the type of error and its location are determined.

Figures 7A, 7C:
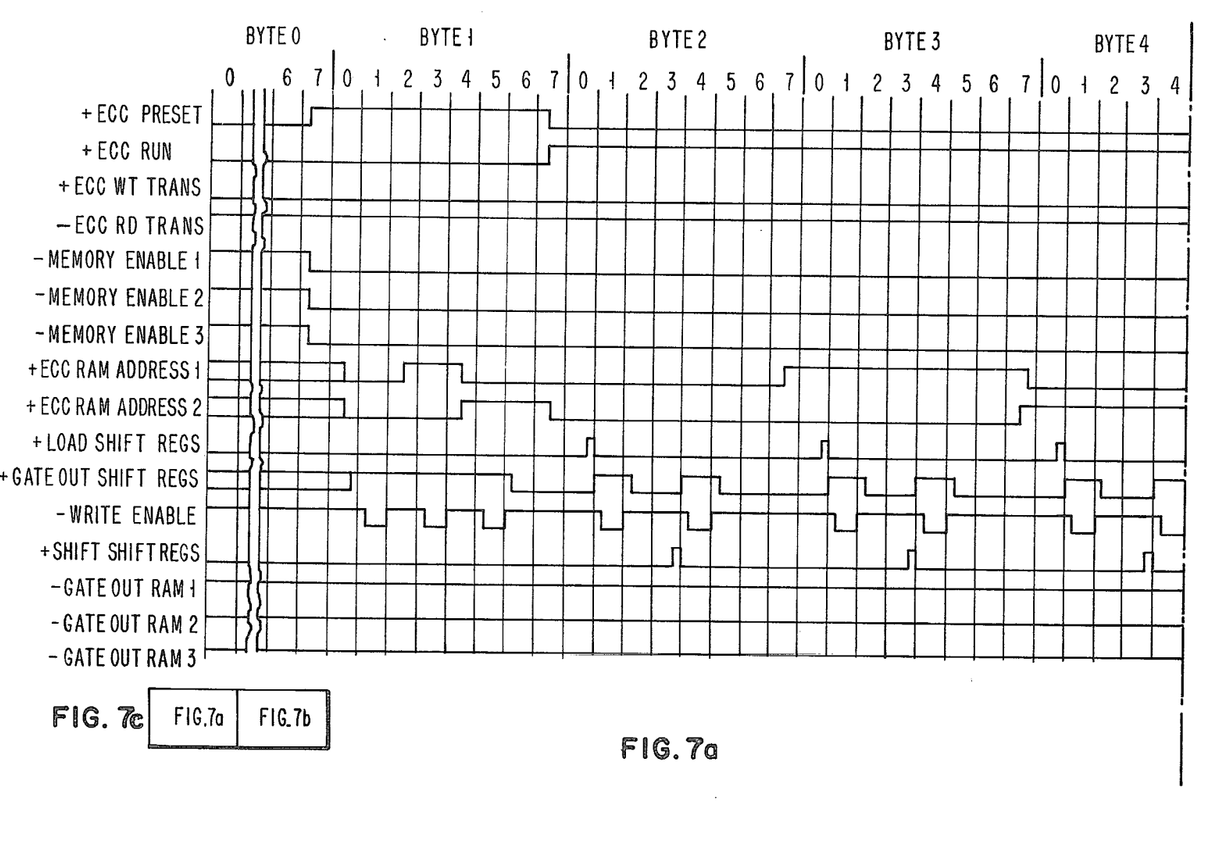
Figure 7B:
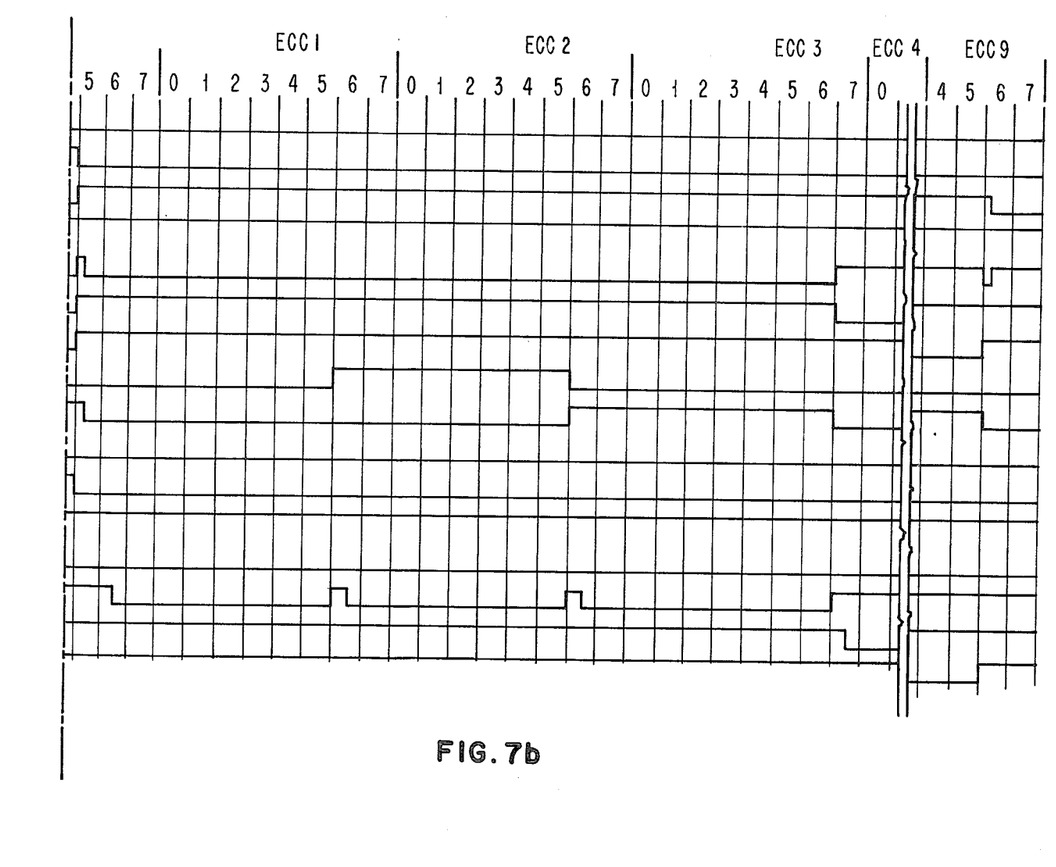

FIGS. 7A and 7B are a timing diagram of the various control signals employed to generate the nine check bytes for the first three bytes of data. As shown in FIG. 7A, the system is initialized by the preset control line from ECC control block 53 being turned on at bit 7 time of zero byte time as indicated in the timing chart. This is as a result of the control ECC preset signal being supplied to control block 53. The preset signal supplied to RAM control block 51 enables the RAM memory 30 of each channel at bit 7 time of byte zero time. The addressing of RAM is indicated by the ECC RAM address lines 1 and 2 which are employed to generate address patterns 00, 01, and 10 so that all three addresses of each RAM are sequentially addressed during byte one time so that data can be entered into address 00 at bit 1 time, address 01 at bit 3 time, and address 10 at bit 5 time.

The Write Enable signal for the memory from RAM control block 51 is also energized during corresponding time periods so that the contents of the shift register of the channel which is an all ones pattern is transferred to each location. The Gate Out Shift Register signal from shift register control block 52 is maintained active from bit 2 time through bit 6 time, as shown. All three locations of RAM 30 contain an all ones pattern at the end of the initializing mode which is completed at the beginning of bit 7 time of byte one, as indicated in FIG. 7A by the ECC preset signal changing to a zero level. At the same time, the system enters the run mode by activating the ECC run signal. During the next byte time, the first byte of data is presented to each channel and each operates to add the first byte to the contents of the RAM output modulo 2 and store the result in location 00 of each RAM. ECC RAM address lines, as shown, are both down during byte time 2, generating address 00.

The load shift register pulse appearing at the end of bit 1 time causes the first data byte to be combined with the output of the RAM and the results entered into the shift register. During bit 2 time, each register receives a gate out shift pulse and a write enable pulse is applied to each RAM, resulting in the transfer of data from the shift register to location 00 of each RAM. During bit 3 time, the shift shift register signal is supplied to channels 2 and 3. This signal merely gates the signals on the inputs to the register into the shift register. The input signals are either the output of the RAM shifted one position, or the output of the RAM shifted one position and exclusively OR'd with the feedback pattern as described earlier. At bit 4 time, the gate out shift register signal and the RAM write enable signal are energized to transfer the new contents of the shift register for the second and third channel to location 00 of their respective RAM.

At the end of byte 2 time, the RAM addresses change to a 01 pattern by changing RAM address line 1. The second byte of data is presented to each channel at the beginning of byte 3 time and loaded to the register by the load shift register pulse at the end of bit time T0 during byte 3 time. The timing of the various signals are identical to those just described for processing data byte 2 into three check bytes and for data byte 3 which is processed during byte time 4, except for the RAM address lines which are changed to the 10 address at the end of byte 3 time.

The system continues to operate on each succeeding group of three data bytes until the end of the data block on a write transfer operation is reached or until the end of the last read ECC check byte on a read transfer operation is reached. At either of these times, the system then changes modes to transfer the ECC check bytes out or the syndrome bytes out to some external device such as the data register, as shown in FIG. 1. On a read operation, at the end of the data block, the RAM addressing system is changed along with the load shift register signals so that the first check byte read is supplied to only channel 1 address 00 and entered into the shift register simultaneously with the newly generated check byte to create the first syndrome byte which is stored at address 00 of channel 1. The remaining check bytes are treated similarly.

The timing signals for the transfer operation to the external device are shown in FIG. 7B. Assuming that the nine ECC check bytes are to be transferred out immediately after the last data byte has been processed, the ECC write transfer is made active at the beginning of bit 5 time of the byte time which is processing the last data byte. All three memory enable lines are deactivated at this time and then memory enable 1 is turned back on for the next three byte times to allow the ECC check bytes to be read out from channel 1. The memory address lines are deactivated so that address 00 is active during the first byte time of the read out process, 01 during the second byte, and 10 during the third byte time. The memory addresses are changed at bit 5 time, as shown.

The gate out RAM 1 line which is supplied to funnel 28 interconnects ECC channel 1 to the external source and is active for the next three byte times. Gate out RAM 2 and 3 signals are active for the next two groups of three byte times, respectively.

Since the output of the funnel may, as shown in FIG. 1, be connected to the input of the register which is supplying data to a serial channel, the first ECC check byte is available to be loaded into the data register immediately following the last data byte, for example, at bit 4 time, merely by switching the input to the data register to the ECC system.

During a read operation, the nine ECC check bytes are processed similarly to the data bytes resulting in the nine syndrome bytes being stored in the RAM. The transfer of the nine syndrome bytes to the data register is identical to the transfer of the nine ECC check bytes, The manner in which the syndrome bytes are generated and converted to error displacements will now be described in connection with FIG. 9 and Table I.

In Table I, columns 1-8 represent all possible binary permutations of an 8 bit byte with each 8 bit permutation expressed as two hexadecimal digits. Columns A-H indicate the position from some preselected starting point of each unique 8 bit permutation. Column $H^1$ represents the position of the syndrome bytes in the m sequence for channel 3.

This sequence, as shown, represents an m sequence which corresponds to the feedback pattern of channel 2. The sequence for channel 3, since it uses a different feedback pattern would be different but would contain all the 8 bit patterns shown in Table I. The occurence of an error in a byte of a subset would be indicated by the parity syndrome byte for that subset having a pattern which is a non-zero pattern. The error pattern would correspond to the position of each one bit in that pattern. For example, if the parity syndrome byte for subset X resulted in an all ones pattern, this would indicate that each bit of some byte in subset X would be in error. The location of that byte is determined by locating the pattern of the syndrome byte in the m sequence table and the pattern of the locator syndrome byte in the same table. The displacement of the locator syndrome byte from the error pattern byte determines the number of byte positions between the byte in error and the last byte of the subset.

Table I

| 1 | A | 2 | B | 3 | C | 4 | D | 5 | E | 6 | F | 7 | G | | 8 | H | $H^1$ |
|---|---|---|---|---|---|---|---|---|---|---|---|---|---|---|---|---|---|
| 01 | 0 | 2F | 32 | E0 | 64 | FC | 96 | 5B | 128 | 22 | 160 | 7A | 192 | | 29 | 224 | |
| 02 | 1 | 5E | 33 | B1 | 65 | 89 | 97 | B6 | 129 | 44 | 161 | F4 | 193 | | 52 | 225 | |
| 04 | 2 | BC | 34 | 13 | 66 | 63 | 98 | 1D | 130 | 88 | 162 | 99 | 194 | | A4 | 226 | |
| 08 | 3 | 09 | 35 | 26 | 67 | C6 | 99 | 3A | 131 | 61 | 163 | 43 | 195 | | 39 | 227 | |
| 10 | 4 | 12 | 36 | 4C | 68 | FD | 100 | 74 | 132 | C2 | 164 | 86 | 196 | | 72 | 228 | |
| 20 | 5 | 24 | 37 | 98 | 69 | 8B | 101 | E8 | 133 | F5 | 165 | 7D | 197 | | E4 | 229 | |
| 40 | 6 | 48 | 38 | 41 | 70 | 67 | 102 | A1 | 134 | 9B | 166 | FA | 198 | | B9 | 230 | |
| 80 | 7 | 90 | 39 | 82 | 71 | CE | 103 | 33 | 135 | 47 | 167 | 85 | 199 | | 03 | 231 | |
| 71 | 8 | 51 | 40 | 75 | 72 | ED | 104 | 66 | 136 | 8E | 168 | 7B | 200 | | 06 | 232 | |
| E2 | 9 | A2 | 41 | EA | 73 | AB | 105 | CC | 137 | 6D | 169 | F6 | 201 | | 0C | 233 | |
| B5 | 10 | 35 | 42 | A5 | 74 | 27 | 106 | E9 | 138 | DA | 170 | 9D | 202 | | 18 | 234 | |
| 1B | 11 | 6A | 43 | 3B | 75 | 4E | 107 | A3 | 139 | C5 | 171 | 4B | 203 | Z | 30 | 235 | 29 |
| 36 | 12 | D4 | 44 | 76 | 76 | 9C | 108 | 37 | 140 | FB | 172 | 96 | 204 | | 60 | 236 | |
| 6C | 13 | D9 | 45 | EC | 77 | 49 | 109 | 6E | 141 | 87 | 173 | 5D | 205 | Z | C0 | 237 | 31 |
| D8 | 14 | C3 | 46 | A9 | 78 | 92 | 110 | DC | 142 | 7F | 174 | BA | 206 | | F1 | 238 | |
| C1 | 15 | F7 | 47 | 23 | 79 | 55 | 111 | C9 | 143 | FE | 175 | 05 | 207 | | 93 | 239 | |
| F3 | 16 | 9F | 48 | 46 | 80 | 44 | 112 | E3 | 144 | 8D | 176 | 0A | 208 | | 57 | 240 | |
| 97 | 17 | 4F | 49 | 8C | 81 | 25 | 113 | B7 | 145 | 6B | 177 | 14 | 209 | | AE | 241 | |
| 5F | 18 | 9E | 50 | 69 | 82 | 4A | 114 | 1F | 146 | D6 | 178 | 28 | 210 | | 2D | 242 | |
| BE | 19 | 4D | 51 | D2 | 83 | 94 | 115 | 3E | 147 | DD | 179 | 50 | 211 | | 5A | 243 | |
| 0D | 20 | 9A | 52 | D5 | 84 | 59 | 116 | 7C | 148 | CB | 180 | A0 | 212 | | B4 | 244 | |
| 1A | 21 | 45 | 53 | DB | 85 | B2 | 117 | F8 | 149 | E7 | 181 | 31 | 213 | | 19 | 245 | |
| 34 | 22 | 8A | 54 | C7 | 86 | 15 | 118 | 81 | 150 | BF | 182 | 62 | 214 | | 32 | 246 | |
| 68 | 23 | 65 | 55 | FF | 87 | 2A | 119 | 73 | 151 | 0F | 183 | C4 | 215 | | 64 | 247 | |
| D0 | 24 | CA | 56 | 8F | 88 | 54 | 120 | E6 | 152 | 1E | 184 | F9 | 216 | | C8 | 248 | |
| D1 | 25 | E5 | 57 | 6F | 89 | A8 | 121 | BD | 153 | 3C | 185 | 83 | 217 | | E1 | 249 | |
| D3 | 26 | BB | 58 | DE | 90 | 21 | 122 | 0B | 154 | 78 | 186 | 77 | 218 | | B3 | 250 | |
| D7 | 27 | 07 | 59 | CD | 91 | 42 | 123 | 16 | 155 | F0 | 187 | EE | 219 | Y | 17 | 251 | 129 |
| DF | 28 | 0E | 60 | EB | 92 | 84 | 124 | 2C | 156 | 91 | 188 | AD | 220 | | 2E | 252 | |
| CF | 29 | 1C | 61 | A7 | 93 | 79 | 125 | 58 | 157 | 53 | 189 | 2B | 221 | Y | 5C | 253 | 131 |
| EF | 30 | 38 | 62 | 3F | 94 | F2 | 126 | B0 | 158 | A6 | 190 | 56 | 222 | | B8 | 254 | |
| AF | 31 | 70 | 63 | 7E | 95 | 95 | 127 | 11 | 159 | 3D | 191 | AC | 223 | | 01 | 255 | |

The displacement will be the same in the sequence chart generated for channel 3 and could be used as an additional check on the operation of the system.

FIG. 9A shows a simplified example which illustrates the above described operation. FIG. 9A shows a serial byte stream of the six data bytes expressed as hex values which are supplied to the system. The channels are indicated on line 1 while the three RAM addresses are indicated on line 2. The nine storage registers each contain an all ones pattern (x"FF") at the start of a write transfer operation. The next line illustrates the first data byte x"C5" being applied to location 00 of all three RAMs, resulting in three intermediate check bytes x"3A", x"74" and x"74" being generated. The chart illustrates how the nine check bytes are generated when the six data bytes are processed by the system. The nine ECC check bytes are illustrated at the bottom of the chart, along with their assigned numerical designations.

If the six data bytes and nine check bytes are again supplied to the system as in a read back operation, the generated syndrome bytes would be all zero, as shown in FIG. 9B. The treatment of the data bytes during the read back is the same as the write process shown in FIG. 9A. The ECC bytes are treated differently in that only one memory location is addressed at a time to generate the respective sydrome byte. Since it was assumed that no error occurred, the syndrome bytes are all zeros.

Now assume that an error occurs in byte positions 1 and 2 of the six byte data stream during read back, as shown in FIG. 9C, so that data byte 0 is unchanged but data byte 1 changes from 18 to 0F and data byte 2 changes from 8E to BE. The syndrome parity byte for subset Y will have a 17 pattern and the syndrome parity byte for subset Z will have a 30 pattern. These patterns indicate an error in some byte of subset Y and some byte of subset Z.

By reference to the m sequence table for the channel 2 feedback pattern, the "17" pattern for the parity syndrome of subset Y is located at position 251 while the pattern of the locator syndrome byte 5C is located at position 253. The difference between these two positions for the Y subset is 2 which indicates that the byte in error in subset Y is the second to last byte of subset Y. A similar result is achieved with the syndrome parity pattern "17" and the syndrome locator pattern 5C for channel 3 by referencing a corresponding table for the channel 3 m sequence, the corresponding positions 129 and 131 being shown in the adjacent column H$^1$ in the table. The error location in subset Z is also the second byte from the end of the subset as indicated in Col. H$^1$ in the table; (237−235)=2 or 31−29=2.

Various arrangements for implementing the above approach have been suggested by the prior art and form no part of the present invention.

While the invention has been particularly shown and described with reference to a preferred embodiment thereof, it will be understood by those skilled in the art that various changes in the form and details may be made therein without departing from the spirit and scope of the invention.

Having thus described our invention, what we claim as new, and desire to secure by Letters Patent is:

1. A system for generating error correcting check bytes for a block of data having a relatively large number of data bytes each consisting of k bits, said system comprising:

(1) first and second check byte generating units, each of which includes means for generating at least one k bit check byte for at least two predefined interleaved subsets of data bytes in said data block wherein each said predefined subset includes no more than $2^k-1$ data bytes;

(2) each said k bit check byte generated by said first unit representing a parity check byte for a different said predefined subset to provide for the subsequent generation of an error pattern syndrome byte for said subset from said parity check byte;

(3) each said k bit check byte generated by said second unit representing an error locator check byte for a different said predefined subset to provide for the subsequent generation of an error locator syndrome byte for said subset from said error locator check byte;

(4) each said k bit check byte generated by said units corresponding to one of $2^k$ unique k bit binary permutations;

(5) each bit of each said locator check byte representing the results of summing modulo 2 preselected bit positions of data bytes in a subset;

(6) said preselected bit positions being selected in accordance with a systematic approach which results in said error locator syndrome byte having a bit pattern which is indicative of the location in said subset of an error pattern corresponding to said error pattern syndrome byte.

(7) whereby an error in said data block within one byte or spanning two adjacent bytes each in a different subset are correctable.

2. The system recited in claim 1 further including means for supplying said first and second check byte generating units with each said byte of said data block.

3. The system recited in claim 2 in which said means supplies each said byte of said data in parallel to each of said units.

4. The combination recited by claim 1 further including a third check byte generating unit identical to said second unit except that different said preselected bit positions are selected in accordance with a different systematic approach.

5. The system recited in claim 4 in which each said systematic approach coresponds to a different m sequence.

6. The system recited in claim 1 in which each said generating unit includes:
   a first register;
   a plurality of individually addressable registers;
   means for transferring the contents of said first register selectively to one of said addressable registers; and
   means for transferring the contents of said addressable registers selectively to said first register.

7. The combination recited in claim 6 in which said addressable registers of each said unit comprise a random access memory.

8. The combination recited in claim 7 further including addressing means for said addressable registers comprising a two-stage counter for simultaneously addressing each said random access memory.

9. The system recited in claim 6 further including means for combining each byte of data of said data block with the contents of a selected one of said addressable registers and for storing the results in said first register.

10. The combination recited in claim 9 further including means for addressing one addressable register in each unit simultaneously.

11. The system recited in claim 10 further including means for sequencing said addressing means one address as each new data byte is entered into said register.

12. The system recited in claim 11 further including means for transferring the contents of said addressable registers to an external device immediately after the last byte of said data block.

13. The system recited in claim 12 in which said transferring means further includes means for sequentially transferring out check bytes from said addressable registers of said unit to an external unit prior to transferring out the contents of the addressable registers of said other unit.

14. The system recited in claim 9 in which said combining means of each said generating unit operates to sum modulo 2 a data byte and said contents of said selected addressable register.

15. The system recited in claim 14 in which said combining means of one of said units further includes means for transferring the contents of a selected one of said addressable registers to said first register rotated one position and from said first register back to said selected addressable register.

16. The combination recited in claim 15 in which said transferring means further includes logic means operable in response to the value of one digit position of said selected addressable register for combining said transferred contents with a predetermined feedback pattern prior to entry into said first register.

17. The system recited in claim 14 in which one of said units includes means for selectively shifting (or rotating) the contents of said addressable register one position.

18. The system recited in claim 17 further including logic means for combining said shifted contents with a predetermined binary pattern.

19. The system recited in claim 18 further including means responsive to the value of one selected bit position of the contents of said addressable register to control the operation of said logic means.

\* \* \* \* \*